US010321593B1

(12) United States Patent
Lettow et al.

(10) Patent No.: US 10,321,593 B1
(45) Date of Patent: Jun. 11, 2019

(54) INTERCONNECT DEVICE

(71) Applicant: VORBECK MATERIALS CORP., Jessup, MD (US)

(72) Inventors: John S. Lettow, Washington, DC (US); Louise Brooks, Washington, DC (US); Paige J. Boehmcke, Baltimore, MD (US); Bretton Swope, Gaithersburg, MD (US); Robyn Nariyoshi, Honolulu, HI (US)

(73) Assignee: VORBECK MATERIALS CORP., Jessup, MD (US)

( * ) Notice: Subject to any disclaimer, the term of this patent is extended or adjusted under 35 U.S.C. 154(b) by 0 days.

(21) Appl. No.: 15/487,429

(22) Filed: Apr. 13, 2017

Related U.S. Application Data

(60) Provisional application No. 62/322,136, filed on Apr. 13, 2016.

(51) Int. Cl.

*H05K 5/00* (2006.01)
*H05K 5/02* (2006.01)
*H05K 1/02* (2006.01)
*H01Q 1/27* (2006.01)

(52) U.S. Cl.

CPC ........... *H05K 5/0247* (2013.01); *H01Q 1/273* (2013.01); *H05K 1/028* (2013.01); *H05K 5/0008* (2013.01); *H05K 5/0013* (2013.01); *H05K 2201/09036* (2013.01)

(58) Field of Classification Search

CPC ......... H05K 5/0247; H05K 2201/0999; H05K 2201/09754; H05K 2201/09036; H05K 5/0008; H05K 5/0013; H05K 1/028; H01R 12/592; H01R 13/627; H01R 13/6277; H01R 4/646; H01R 13/2442; H01R 13/2492; H01R 12/78; H01Q 1/273

USPC ...... 361/749; 439/44, 47, 48, 49, 50, 51, 52, 439/53, 77

See application file for complete search history.

(56) References Cited

U.S. PATENT DOCUMENTS 6,929,487 B1 * 8/2005 Raghavendra ..... H01R 13/6658 439/654
2004/0209396 A1 * 10/2004 Krulevitch ........... A61N 1/0452 438/106
2005/0054941 A1 * 3/2005 Ting ..................... A61B 5/0408 600/529
2007/0105404 A1 * 5/2007 Lee ..................... H01R 12/592 439/37

(Continued)

*Primary Examiner* — Roshn K Varghese
(74) *Attorney, Agent, or Firm* — Trentice V. Bolar, Esq.

(57) ABSTRACT

Generally speaking, pursuant to various embodiments, interconnect apparatuses are provided herein to couple flexible circuits to control circuits. In some embodiments, the apparatus can include a first portion housing one or more control circuits and a second portion conductively coupled to a flexible circuit. In some embodiments, the first portion may be configured to be coupled to the second portion such that the control circuit can be conductively coupled to the flexible circuit when the first portion is coupled to the second portion. In some embodiments, the control circuit can be configured to capture temperature readings. In some embodiments, the control circuit can be configured to capture proximity readings. In some embodiments, the control circuit can be configured to include one or more communications devices.

16 Claims, 9 Drawing Sheets

100
A
300
B

(56) References Cited

U.S. PATENT DOCUMENTS

2013/0033810 A1* 2/2013 Crain .................... C09D 7/70
361/679.32
2013/0323946 A1* 12/2013 Ritner .................. H01R 12/771
439/83

* cited by examiner

INTERCONNECT DEVICE

CROSS-REFERENCE TO RELATED APPLICATIONS

This application claims priority to U.S. Provisional Application No. 62/322,136, filed Apr. 13, 2016, which is hereby incorporated herein by reference in its entirety.

TECHNICAL FIELD

Background

The present invention relates generally to interconnect devices. Interconnects are typically structures that are configured to conductively couple two or more separate devices together. Flexible circuits can be configured to include one or more insulating materials upon which one or more conductive circuit patterns may be applied (e.g., formed by etching metal foil cladding from polymer bases, plating metal or printing of conductive inks). For example, flexible circuits may or may not have electrical components attached thereto. A protective coating may be applied to one or more surfaces of the flexible circuits (e.g., to reduce or eliminate the effects of impacts and/or climate conditions).

DETAILED DESCRIPTION

Figure 1:
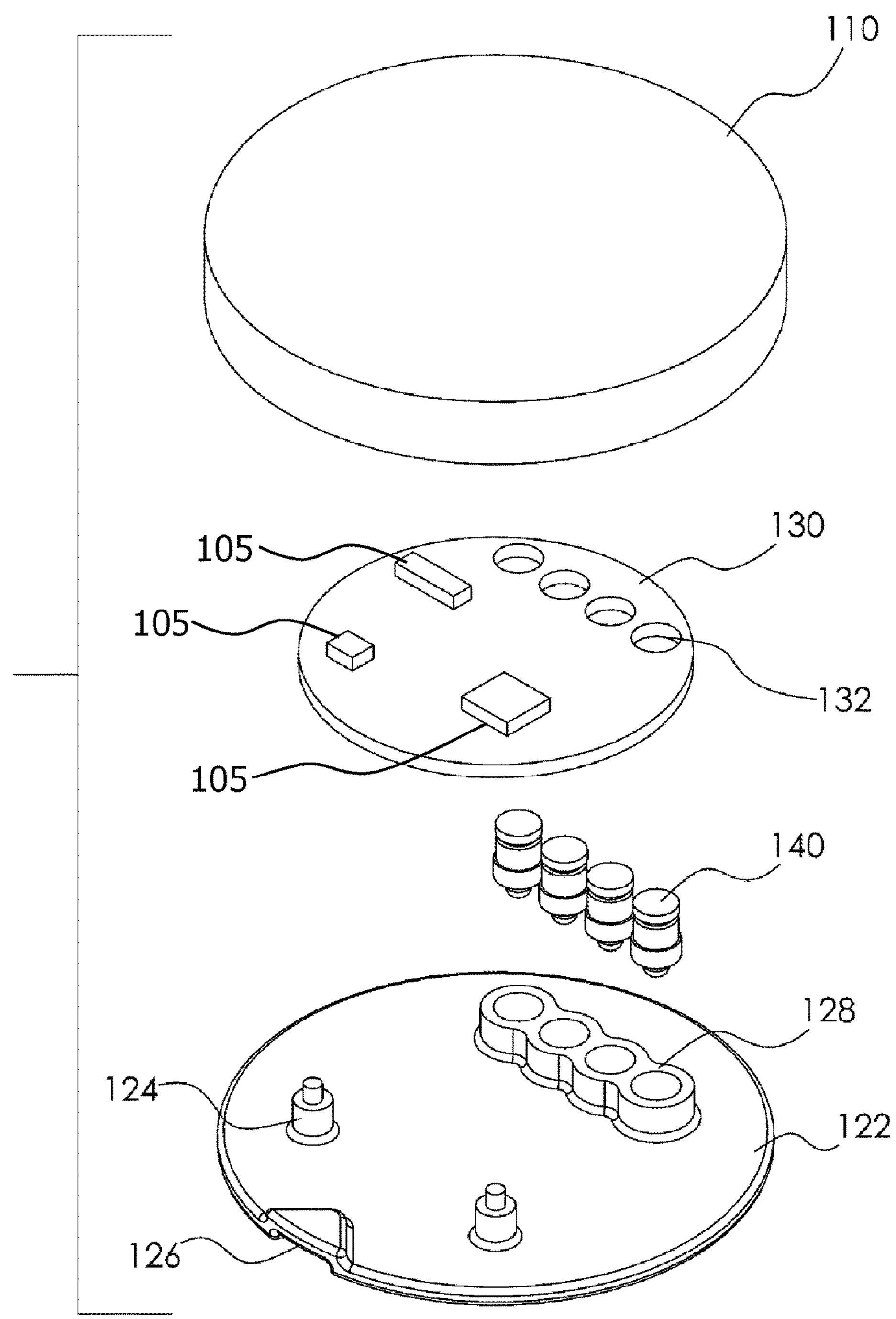
FIG. 1 illustrates an interconnect, in accordance with some embodiments.
Figure 2:
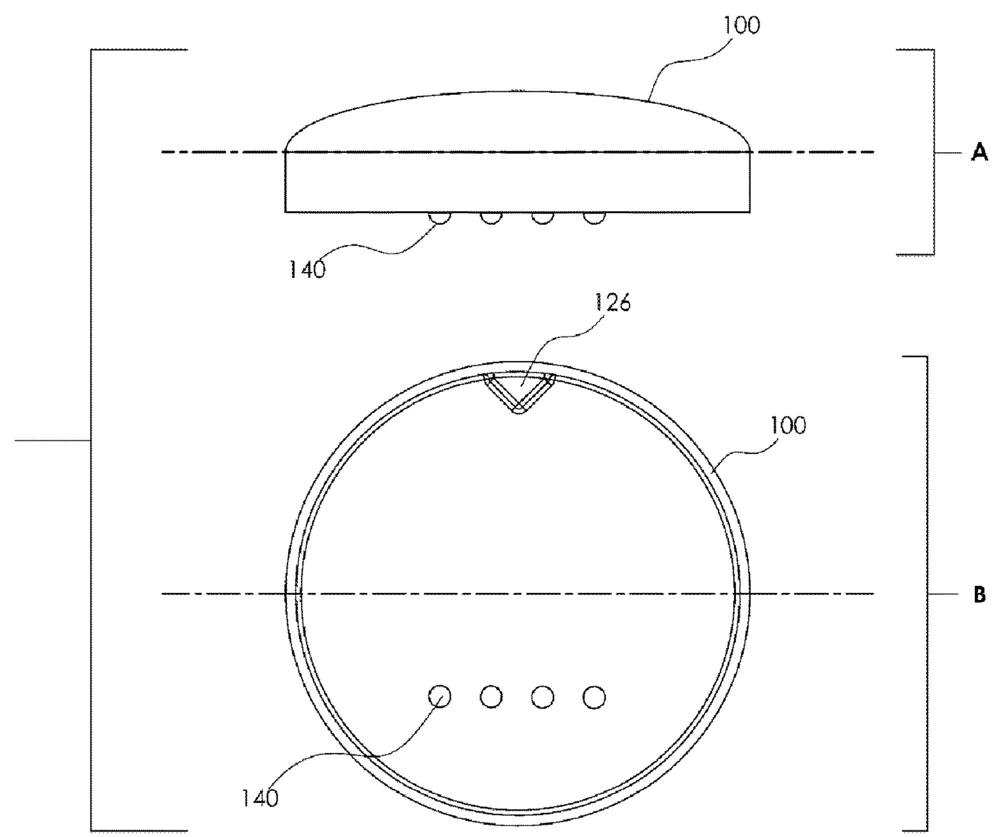
FIG. 2 illustrates an interconnect, in accordance with some embodiments.

The descriptions of the various embodiments are presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Certain terminology may be employed in the following description for convenience rather than for any limiting purpose. For example, the terms "forward" and "rearward," "front" and "rear," "right" and "left," "upper" and "lower," and "top" and "bottom" designate directions in the drawings to which reference is made, with the terms "inward," "inner," "interior," or "inboard" and "outward," "outer,"

"exterior," or "outboard" referring, respectively, to directions toward and away from the center of the referenced element, the terms "radial" or "horizontal" and "axial" or "vertical" referring, respectively, to directions or planes which are perpendicular, in the case of radial or horizontal, or parallel, in the case of axial or vertical, to the longitudinal central axis of the referenced element, and the terms "downstream" and "upstream" referring, respectively, to directions in and opposite that of fluid flow. Terminology of similar import other than the words specifically mentioned above likewise is to be considered as being used for purposes of convenience rather than in any limiting sense.

Generally speaking, pursuant to various embodiments, interconnect apparatuses are provided herein to couple flexible circuits to control circuits. In some embodiments, the apparatus can include a first portion housing one or more control circuits and a second portion conductively coupled to a flexible circuit. In some embodiments, the first portion may be configured to be coupled to the second portion such that the control circuit can be conductively coupled to the flexible circuit when the first portion is coupled to the second portion. In some embodiments, the control circuit can be configured to capture temperature readings. In some embodiments, the control circuit can be configured to capture proximity readings. In some embodiments, the control circuit can be configured to include one or more communications devices.

In some embodiments, the flexible circuit can be configured to comprise one or more conductive traces conductively coupled to one or more antenna elements. In some embodiments, the control circuit can be configured to include one or more antenna elements. In some embodiments, at least one of the first portion and the second portion can be configured to include PET, PE, Kapton, and/or PVC. In some embodiments, the first portion and the second portion can be configured to include a first orienting element and a second orienting element, respectively, wherein the first orienting element and the second orienting element can be configured to engage each other and thereby couple the first portion to the second portion.

In some embodiments, the first portion and the second portion can be configured to be coupled together via a snap action. In some embodiments, the first portion can be configured to be selectively coupled to the second portion. Interconnects are typically structures that are configured to conductively couple two or more separate devices together. Flexible circuits can be configured to include one or more insulating materials upon which one or more conductive circuit patterns may be applied (e.g., formed by etching metal foil cladding from polymer bases, plating metal or printing of conductive inks). For example, flexible circuits may have one or more electrical components attached thereto (e.g., control circuits, energy storage devices, information stores, communications units, antennas, similar electrical components, or a combination of two or more thereof). A protective coating may be applied to one or more surfaces of the flexible circuits (e.g., to reduce or eliminate the effects of impacts and/or climate conditions experienced by the flexible circuit). For example, the flexible circuits can be included in an apparel item worn (i.e. a wearable computing device) by a human or other mammal (e.g., dog, cat, horse, bovine, similar mammals).

In some embodiments, the interconnects discloses herein are configured to establish a plurality of conductive couplings between control circuits and flexible circuits. As used herein, "control circuit" refers to an electronic device that can include one more individual electronic components 105

(e.g., resistors, transistors, capacitors, inductors, diodes, antennas, similar electronic components, or a combination of two or more thereof) conductively coupled to at least one conductive trace (e.g., wires, printed circuits, painted circuits, and similar conductive paths).

In some embodiments, the conductive traces can be formed using a conductive composition. For example, the conductive composition can include one or more of fully exfoliated single sheets graphites (i.e. graphene sheets), metals (e.g., silver, copper, gold, zinc, carbon black, brass, similar metals, or a combination of two or more thereof), graphite, carbon nanotubes, or a combination of two or more thereof. The conductive composition can include one or more conductive polymers. In general, the conductive composition can comprise any conductive material, in accordance with some embodiments.

In some embodiments, the conductive trace can be applied to the surface of a substrate using a printing technique. In some embodiments, the substrate can include one or more polymers, for example, PET, PE, polyimides, PVC, and/or similar non-electrically conductive polymers (i.e. electrically insulating polymers) that can maintain structural integrity during application of electricity to the conductive traces. In some embodiments, the conductive traces can include etched metals (e.g., copper, silver, aluminum, zinc, gold, brass, similar metals, or a combination of two or more thereof). Conductive traces can include sheet metal that is applied to the substrate surface.

Referring now to FIGS. 1-4. In some embodiments, the interconnect (e.g., interconnect 500) can comprise a first portion 100 and a second portion 300, wherein the second portion can be conductively coupled to and in direct communication with a flexible circuit 330. In some embodiments, at least one of the below discussed components of the first portion 100, the second portion 300, the first portion 600, and the second portion 800 can each be fabricated by injection molding, low pressure injection molding, additive fabrication, similar fabrication methods, or a combination of two or more thereof. In some embodiments, the first portion 100 can include a support plate 122 that is configured to receive a housing shell 110 such that when joined together form a void into which control circuit 130 can be positioned. The housing shell 110 can be configured to be a hollow structure having a circumference that is approximate to the circumference of the support plate 122. In some embodiments, the housing shell 110 can have an outwardly convexed top surface (e.g., a curved, domed, or flat top) that is supported by a lateral wall extending from the periphery of the top surface.

In some embodiments, the support plate 122 can be configured as a substantially planar surface having support structures 124, conduits 128, and interengaging notch 126 each extending vertically therefrom. In some embodiments, support structures 124 and conduits 128 together can provide resting support for the control circuit 130. In some embodiments, support structures 124 and conduits 128 together provide a uniform height sufficient to provide a void between the control circuit 130 and the support plate 122. For example, the void can provide a pocket of air beneath the control circuit 130 that can facilitate cooling (e.g., reduce or inhibit heat buildup) of the control circuit 130 and keep the unit within operational parameters. In some embodiments, the support plate 122 can be configured to have a circumference that compliments that of the housing shell 110 (e.g., a disc configuration).

In embodiments, the conduits 128 can extend laterally in a region of the support plate 122 opposing the region that include the support structures 124. In some embodiments, each conduit 128 shares a wall with the conduit 128 positioned adjacent thereto. For example, the walls each have a circumference greater than that of an opening 132. In some embodiments, the control circuit 130 can be configured to include a plurality of openings 132 that are voids configured to have a circumference that accepts the conducting elements 140 such that the each conducting element 140 can rest flush with the inner wall of the respective opening 132 (e.g., to facilitate conductive communication therebetween).

For example, each opening 132 and conduit 128 can be configured to accept (i.e., has complementary structures with) a respective conducting element 140. Openings 132 and conduits 128 can each have structures that are complementary to a respective conducting element 140. Each conductive element 140 can be configured to be conductively coupled to the control circuit 130 upon insertion in to a respective opening 132. In some embodiments, conducting elements 140 can each have a cylindrical body with a top surface and a bottom surface. For example, the bottom surface can be configured to have a convexed, conical, pointed, or similar protruding structure configured to contact a respective conductive trace 335 (discussed further below).

FIGS. 2A-2B illustrate a side and a bottom view of the first portion 100, respectively. Specifically, FIG. 2A depicts conducting elements 140 extending beyond the bottom surface of the support plate 122. Rotating clockwise 90° along the dotted line axis, FIG. 2B depicts the bottom surface of the support plate 122 where interengaging notch 126 is positioned along the top periphery thereof and conducting elements 140 are laterally positioned in the bottom region thereof.

Figure 3:
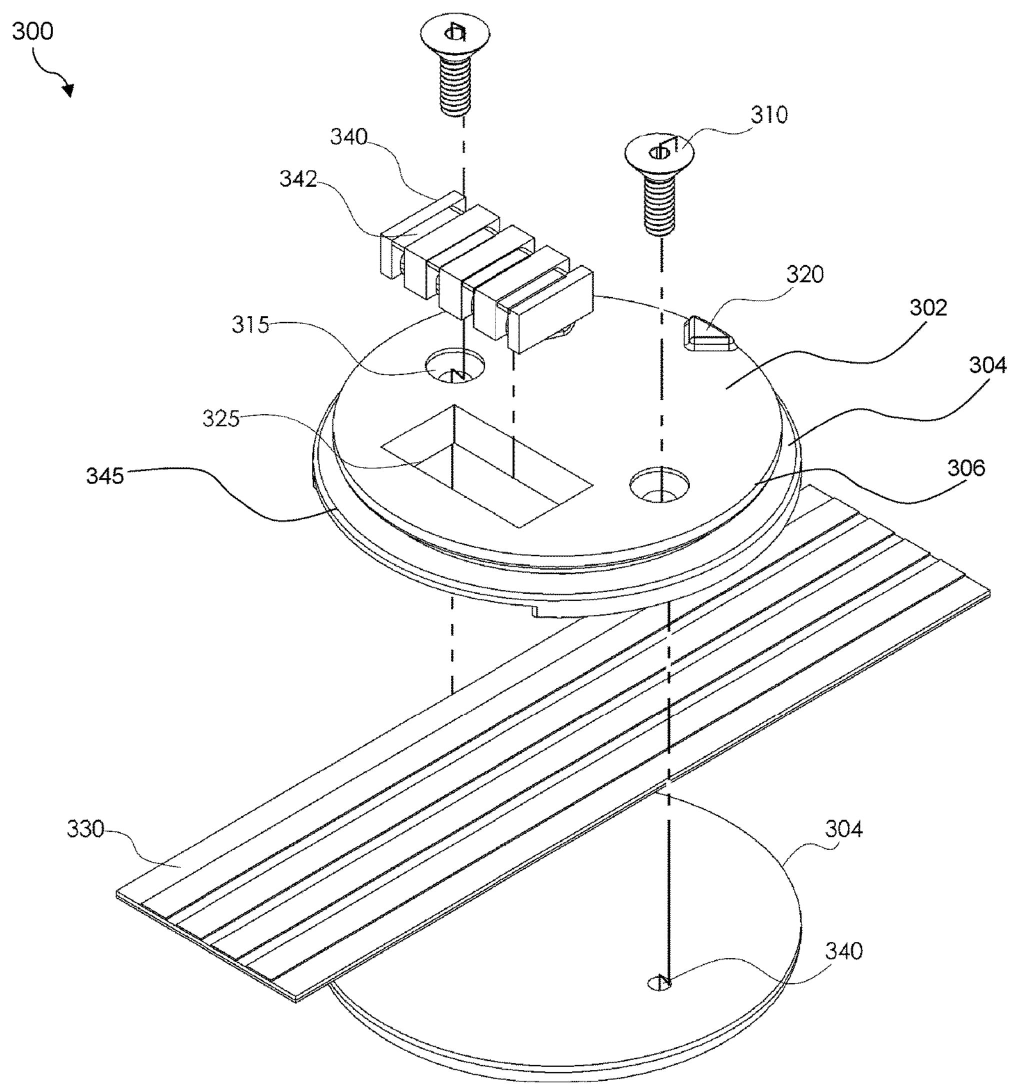
FIG. 3 illustrates an interconnect, in accordance with some embodiments.

Referring now to FIG. 3. In some embodiments, the second portion 300 can be a seat assembly configured to couple to the first portion 100. For example, the second portion 300 can be a structure configured to facilitate conductive communication between the flexible circuit 330 and the control circuit 130 via selective coupling with the first portion 100. In some embodiments, the second portion 300 can include a first sear housing 302 and a second seat dousing 304 configured such that when coupled together (e.g., via fasteners 310) they form a housing around a portion of the flexible circuit 309. In some embodiments, the second portion 300 can be configured to receive the first portion 100. For example, the first seat housing 302 can include a substantially planar top surface having a flange 305 that extends peripherally from the lateral walls 306 of the top surface and having a width sufficient to allow the first portion 100 to rest upon when coupled to the second portion 300. In some embodiments, the flange 305 can include adjacent longitudinal co-extensive lateral recesses 345 configured to flank the conductive trace 335.

In some embodiments, the top surface of the first seat housing 302 can include an interengaging notch 320 configured to engage interengaging notch 126 and thereby orient the first portion 100 in a particular direction relative to the second portion 300 when the first portion 100 and the second portion 300 are coupled together. For example, interengaging notches 126 and 320 can each include a magnet member affixed to an underside thereof and configured to engage each other such that the first portion 100 and the second portion 300 are coupled together as a result of the magnetic engagement.

The first seat housing 302 can be affixed to the second sear housing 304 via fasteners 310. For example, a fastener 310 can be a screw (e.g., a fastener with a spirally grooved shaft) configured to be inserted through a respective aperture 315 and frictionally engage a respective passage 340 to embed a portion of itself in the passage. In some embodiments, the first seat dousing 302 can be configured to include an opening 325 positioned on the top surface of the first seat housing in a region opposing the interengaging notch 320 and adjacent to apertures 315. The opening 325 can completely extend through the top surface to expose a portion of the flexible circuit 330 when the first seat housing 302 and the second seat housing 304 are coupled together via fasteners 310. Opening 325 can be configured to receive guide 340.

Figure 4:
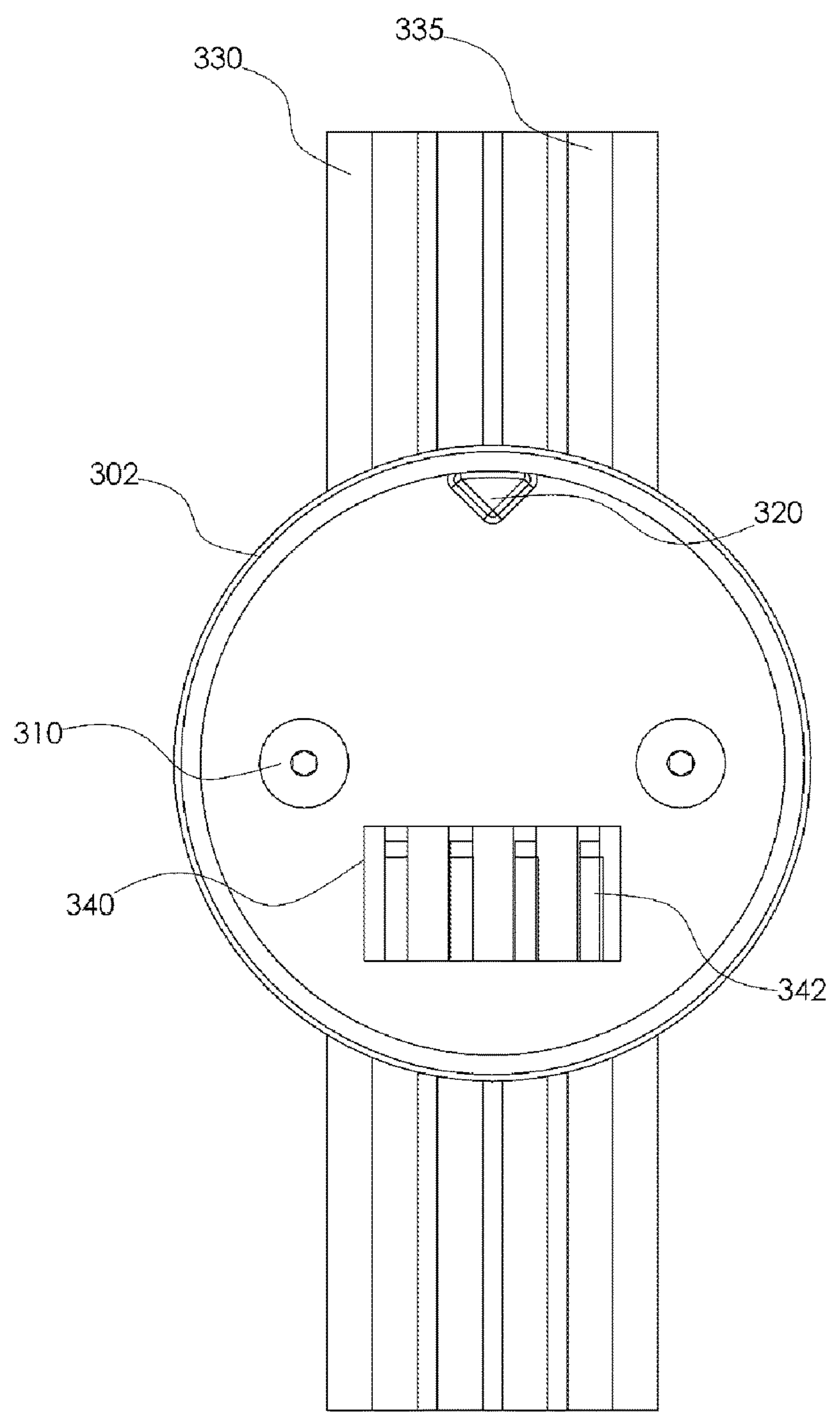
FIG. 4 illustrates an interconnect, in accordance with some embodiments.

The opening 325 can be configured to orient the guide 340 such that each of the conducting elements 342 are conductively coupled to a respective conductive trace 335. In some embodiments, the guide 340 can be configured to have an overall structure that complements the shape of the opening 325 (e.g., block, rectangular, similar shapes, etc.). The guide 340 can be configured to have several channels (e.g., grooves, slits, cavities, slots, etc.) that each run across each longitudinal surface of the guide 340. Each conducting element 342 can be configured to sit in a respective channel of the guide 340 such that the conducting element 342 can contact a respective conductive trace 335 when the guide 340 engages the opening 325 and can contact a respective conducting element 140 when the first portion 100 is coupled to the second portion 300. FIG. 4 illustrates a top view of an assembled second portion 300. Specifically, FIG. 4 illustrates that each conducting element 342 is aligned relative to a respective conductive trace 335.

Figure 5:
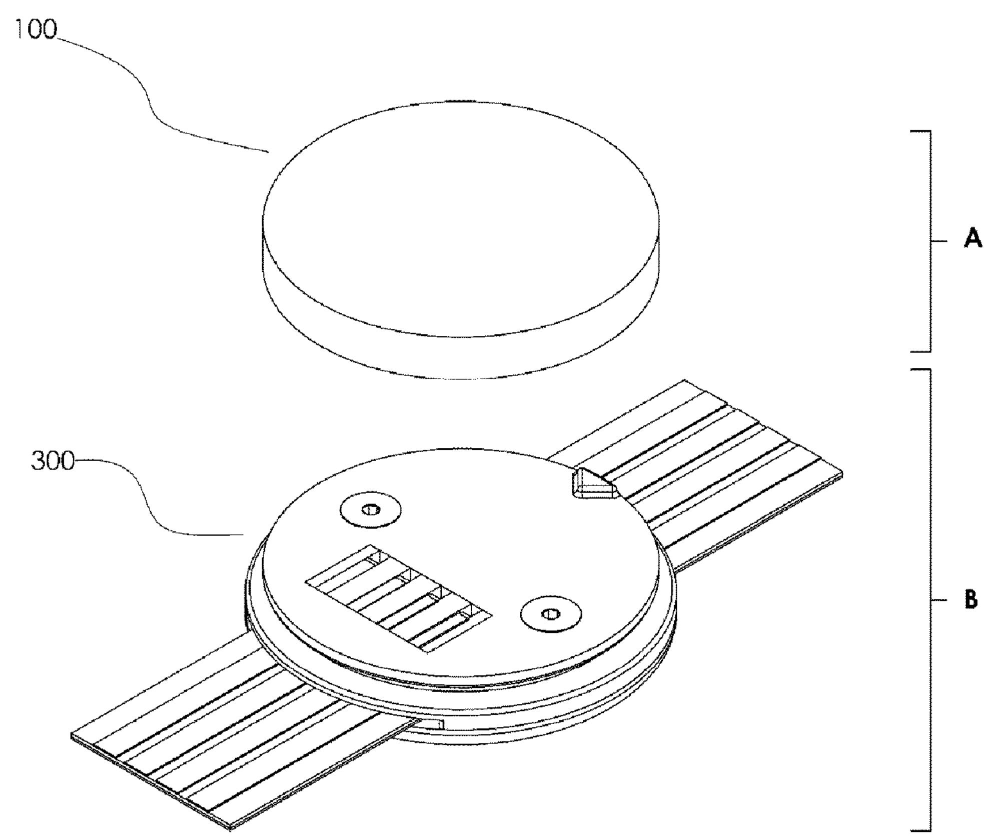
FIG. 5 illustrates an interconnect, in accordance with some embodiments.
Figure 6:
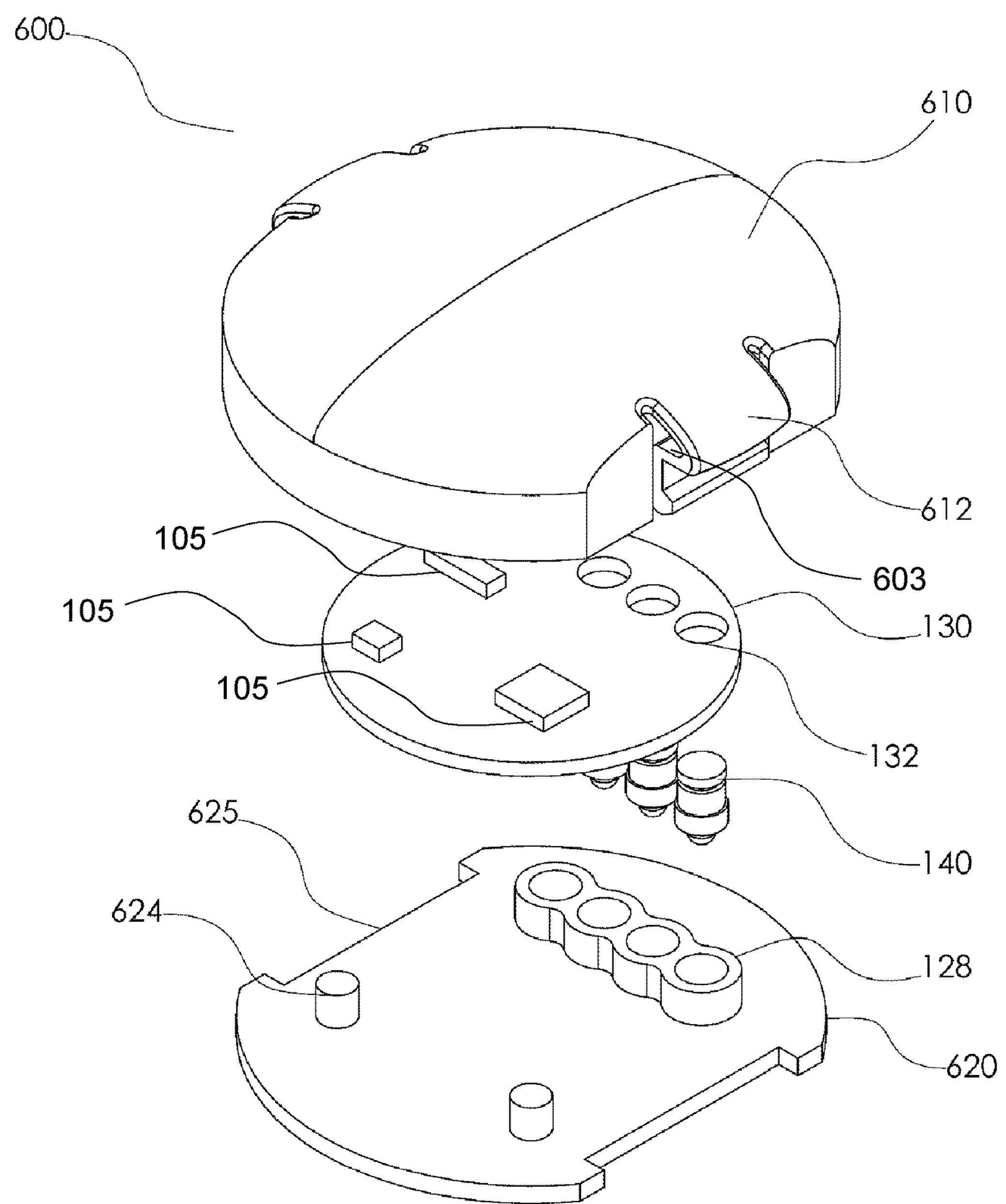
FIG. 6 illustrates an interconnect, in accordance with some embodiments.

FIG. 5 illustrates the manner in which the first portion 100 can engage the second portion 300, in accordance with some embodiments. Referring now to FIGS. 6-9. Specifically, FIGS. 6-9 depict interconnect 900, which is configured to be at least partially assembled via a snap action. In some embodiments, the interconnect 900 can include first portion 600 and second portion 800, which can be configured to be coupled together via a snap motion. The first portion 600 can be configured to include housing shell 610. In some embodiments, housing shell 610 can be configured as shell structure that can provide a protective covering for at least one of the control circuit 130, the conductive elements 140, and the support plate 620. For example, housing shell 610 can be configured to have at least two coupling elements 612 extending from opposing sides of the housing shell 610. Coupling elements 612 can each be configured as a continuous structure of the housing shell 610.

In some embodiments, each coupling element 612 can be configured as a latch having a shelf spaced laterally inward from the lateral wall of the housing shell 610 can forming a front-to-rear gap therebetween. For example, the shelf can be configured to receive the support plate 620. In some embodiments, the coupling elements 612 can be configured to couple the support plate 620 to the housing shell 610 via a snap action such that the support plate 620 rests on the shelf 630 of each respective coupling element 612. The first portion 600 and the second portion 800 can be configured to be coupled together via the coupling elements 612 (e.g., via a snap action provided via the coupling elements engaging the ribs 830). In some embodiments, the support plate 620 can be configured to include indentation 625 positioned on opposing sides of the support plate 620 and each having two ends such that each indentation 625 is positioned adjacent to the conduits 128 at one end and support structures 624 at the other end.

Figure 7:
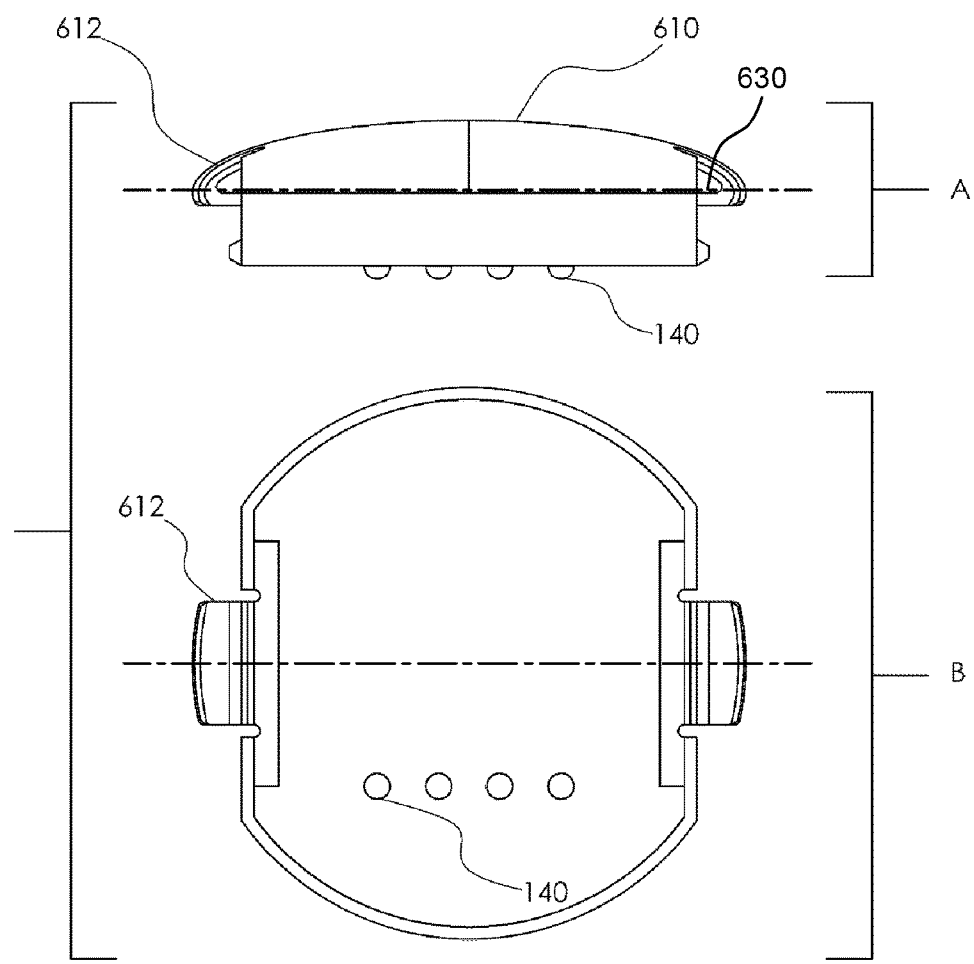
FIG. 7 illustrates an interconnect, in accordance with some embodiments.
Figure 8:
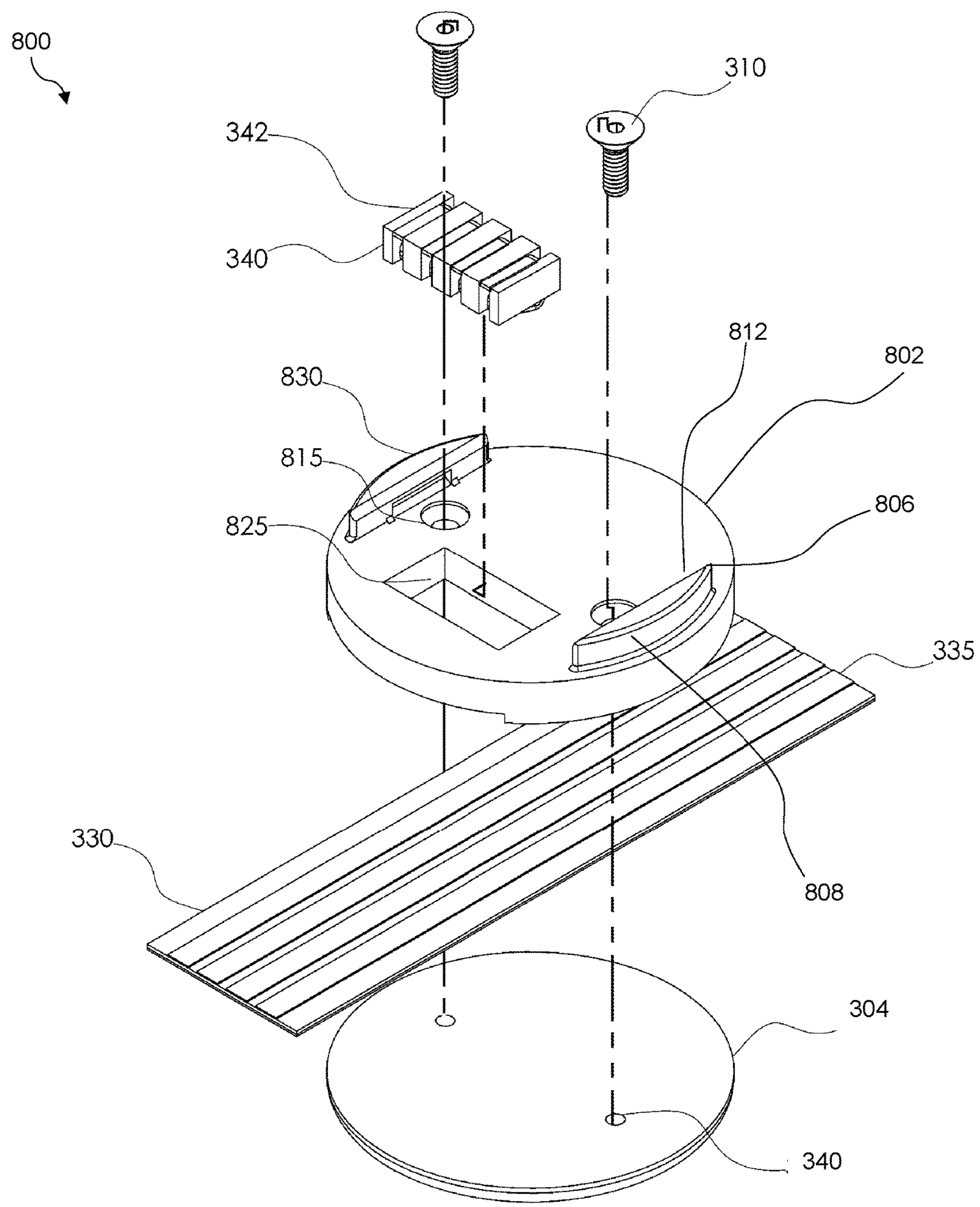
FIG. 8 illustrates an interconnect, in accordance with some embodiments.

Each indentation 625 can be configured to rest on the shelf 630 formed on the inner surface of a coupling element 612 when the support plate 620 is coupled to the housing shell 610. In some embodiments, the support plate 620 can be configured to include conduits 128 (discussed above) and support structures 624. For example, support structures 624 can be configured to perform similar structural functionalities as support structures 124 (discussed above). Support plate 620 can be configured to have an overall shape that complements the shape of housing shell 610. Referring now to FIG. 7. FIGS. 7A and 7B illustrate a side view, and bottom view of an assembled version of the first portion 600.

In some embodiments, the second portion 800 can be a seat assembly configured to couple to the first portion 600 (e.g., via the snap action discussed above). In some embodiments, the second portion 800 can include a first seat housing 802 configured to be coupled to the second seat housing 304 (e.g., via each fastener 310 passing through a respective aperture 815 and physically engaging a respective passage 340 as described above) to form a housing around a portion of the flexible circuit 330. In some embodiments, the second portion 800 can be configured to receive the first portion 600. For example, the first seat housing 802 can be configured to have a substantially planar top surface. Ribs 830 can be configured to extend vertically from opposing sides of the first seat housing 802 such that each rib 830 is positioned adjacent to aperture 815.

In some embodiments, each rib 830 can be configured to be a substantially D-shaped member extending from the top surface of the first sear housing 802. For example, each rib 830 can be configured to have a convexed outer lateral surface 808 and a substantially planar inner lateral surface 812 (i.e., facing the center of the top surface of the first housing 802) such that the outer lateral surface 808 can be oriented superficially relative to the periphery of the first seat housing 802 and the inner lateral surface 812 can be oriented relative to the nearest aperture 815. In some embodiments, the top surface of each rib 830 can be configured to include a flange 806 that extends along the top periphery of the outer lateral surface 808. For example, the flange 806 can be configured to rest on the shelf 630 formed by the inner surface of a coupling element 610 when the first portion 600 and the second portion 800 are coupled together.

Figure 9:
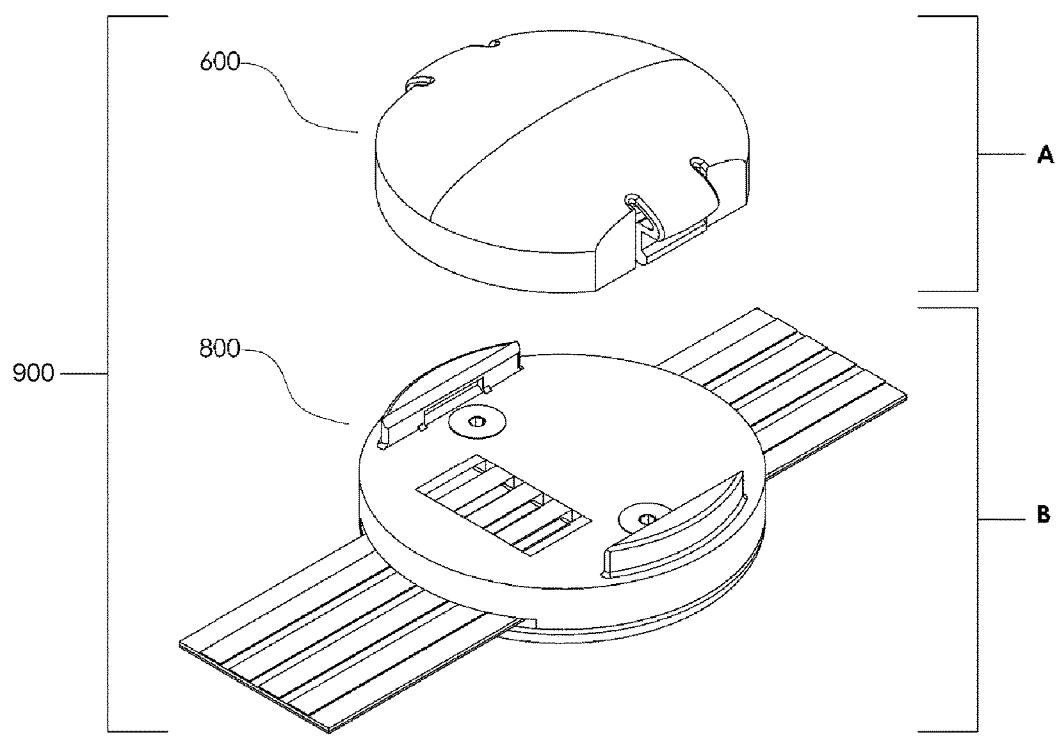
FIG. 9 illustrates an interconnect, in accordance with some embodiments.

In some embodiments, the lateral surface 808 of the first seat housing 802 can include adjacent longitudinal coextensive lateral recesses configured to flank the conductive trace 335. In some embodiments, the first seat housing 802 can be configured to have an opening 825 that extends completely through the surface thereof (e.g., as described above). Opening 825 can be configured to receive guide 340 as discussed above relative to opening 325. For example, opening 825 can be configured to position guide 340 such that each of the conducting elements 342 are conductively coupled to a respective conductive trace 335. FIG. 9 illustrates an exemplary manner by which the first portion 600 and the second portion 800 can be coupled together to form the interconnect 900.

The control circuits 130 can be configured to include one or more sensors, thermometers, I/O devices, AN components, and communication units. For example, the control circuit 130 can be configured to measure and/or detect one or more molecules (e.g., hazardous and non-hazardous molecules, including but not limited to, methane, propane, oxygen, $CO_2$, CO, $H_2O$ (i.e. humidity) and chlorine). The control circuit 130 can be configured to monitor and/or detect orientation and/or acceleration. The control circuit 130 can be configured to include one or more proximity sensors to determine proximity of the control circuit relative to one or more objects (e.g., to determine water level, locate studs, or automatically map a particular area within a threshold distance relative to the control circuit 130).

The control circuit 130 can be configured to communicate with another control circuit. The control circuit 130 can be configured to comprise one or more data stores (e.g., for storage of data generated by the control circuit 130 and/or data received from another control circuit). For example, the control circuit may comprise one or more communications modules that are configured to utilize one or more communications protocols and frequencies to communicate with one or more other control circuits, including but not limited to, Wi-Fi, LTE, and SATCOM, C-band, X-band, Ku-band, Ka-band, VHF, UHF, similar communications protocols, similar frequencies, or a combination of two or more thereof. In some embodiments, the control circuit 130 can include one or more antennas. In some embodiments, the control circuit 130 can be conductively coupled to one or more external antennas via one or more conductive traces 335.

As various modifications could be made in the constructions and methods herein described and illustrated without departing from the scope of the invention, it is intended that all matter contained in the foregoing description or shown in the accompanying drawings shall be interpreted as illustrative rather than limiting. Thus the breadth and scope of the present invention should not be limited by any of the above-described exemplary embodiments, but should be defined only in accordance with the following claims appended hereto and their equivalents.

What is claimed is:

1. An interconnect apparatus comprising:

a first portion housing a control circuit;

a second portion conductively coupled to a flexible circuit, the second portion comprising a first seat housing and a second seat housing coupled together to form a housing around a portion of the flexible circuit; and wherein the first portion is configured to be coupled to the second portion such that the control circuit is conductively coupled to the flexible circuit when the first portion is coupled to the second portion;

the flexible circuit is included in an apparel item;

the first seat housing comprising a lateral wall and a flange extending peripherally from the lateral wall; and the flange comprising a longitudinal co-extensive lateral recess flanking the flexible circuit.

2. The apparatus of claim 1, wherein the first portion comprises a housing shell and a support plate coupled together to form a hollow structure into which the control circuit is positioned.

3. The apparatus of claim 1, wherein the second portion comprises a guide; the first seat housing comprises a void that exposes a portion of the flexible circuit and receives the guide; the guide comprises a conducting element; the conductive element conductively couples to the flexible circuit and the control circuit when the first portion couples to the second portion.

4. The apparatus of claim 1, wherein the flexible circuit comprises a conductive trace applied thereto; and the conductive trace comprises a conductive composition, the conductive composition comprises graphene sheets and a polymer.

5. The apparatus of claim 1, wherein the first portion and/or the second portion comprises PET, PE, Kapton, and/or PVC.

6. The apparatus of claim 1, wherein the first portion and the second portion comprise a first interengaging element and a second interengaging element, respectively;

the first interengaging element and the second interengaging element are configured to engage each other and thereby orient the first portion relative to the second portion.

7. The apparatus of claim 1, wherein the first portion comprises a housing shell coupled to a support plate; the housing shell comprises a shelf spaced laterally inward from a lateral wall of the housing shell and forms a front-to-rear gap therebetween; and the shelf receives the control circuit.

8. The apparatus of claim 1, wherein the first portion comprises a housing shell coupled to a support plate;

the support plate comprises a conduit and support element, the conduit receives a conductive element conductively coupled to the control circuit; and the conduit and support element together provide resting support for the control circuit; and an air pocket beneath the control circuit to facilitate cooling of the control circuit.

9. An interconnect apparatus, comprising:

a first portion comprising a control circuit housed therein;

a second portion coupled to the first portion, the second portion comprising a first seat housing and a second seat housing coupled together and forming a housing around a portion of a flexible circuit, the first seat housing comprising a lateral wall and a flange extending peripherally from the lateral wall; and a guide positioned within a void of the first seat housing and comprising a conducting element conductively coupled to the flexible circuit and the control circuit, the void exposing a portion of the flexible circuit to the guide;

wherein the control circuit is positioned proximate to the flexible circuit;

the flexible circuit is included in an apparel item;

the void orients the guide to conductively couple the conductive element to the flexible circuit;

the flange comprising a longitudinal co-extensive lateral recess flanking the flexible circuit.

10. The apparatus of claim 9, wherein the first portion comprises a housing shell and a support plate coupled together to form a hollow structure into which the control circuit may be positioned.

11. The apparatus of claim 9, wherein the flexible circuit comprises a conductive trace applied thereto;

the conductive trace comprises a conductive composition; and the conductive composition comprises graphene sheets and a polymer.

12. The apparatus of claim 9, wherein the first portion and the second portion comprise a first interengaging element and a second interengaging element, respectively;

the first interengaging element and the second interengaging element are configured to engage each other and thereby orient the first portion relative to the second portion.

13. The apparatus of claim 9, wherein the first portion comprises a housing shell coupled to a support plate; the housing shell comprises a shelf spaced laterally inward from a lateral wall of the housing shell and forms a front-to-rear gap therebetween; and the shelf receives the control circuit.

14. The apparatus of claim 9, wherein the control circuit comprises a protruding conductive element comprising a cylindrical body, top surface, and bottom surface;

the first portion comprises a housing shell coupled to a support plate;

the support plate comprises a conduit and a support element each extending vertically from a surface of the support plate;

the protruding conducting elements extend through the conduit and conductively couple to the flexible circuit the conduit is positioned opposite the support; and the conduit and support element together provide resting support for the control circuit; and an air pocket beneath the control circuit to facilitate cooling of the control circuit.

15. An interconnect apparatus, comprising:

a first portion coupled to a second portion and comprising a housing shell coupled to a support plate thereby forming a hollow structure within which the control circuit is positioned, the second portion conductively coupled to a flexible circuit and comprising a first seat housing and a second seat housing coupled together thereby forming a housing around a portion of the flexible circuit;

a control circuit positioned within the first portion;

wherein the flexible circuit is included in an apparel item;

the first seat housing comprising a lateral wall and a flange extending peripherally from the lateral wall; and the flange comprising a longitudinal co-extensive lateral recess flanking the flexible circuit.

16. The apparatus of claim 15, wherein the second portion comprises a guide positioned in a void of the first seat housing, the void exposing a portion of the flexible circuit to the guide; and the guide comprises a conducting element conductively coupled to the flexible circuit and the control circuit when the first portion is coupled to the second portion.

* * * * *